US012648258B2

(12) United States Patent
Liu et al.

(10) Patent No.: US 12,648,258 B2
(45) Date of Patent: Jun. 2, 2026

(54) BACK-CONTACT SOLAR CELL, BATTERY ASSEMBLY AND PHOTOVOLTAIC SYSTEM

(71) Applicants: ZHUHAI FUSHAN AIKO SOLAR TECHNOLOGY CO., LTD., Zhuhai (CN); ZHEJIANG AIKO SOLAR ENERGY TECHNOLOGY CO., LTD., Yiwu City (CN); TIANJIN AIKO SOLAR ENERGY TECHNOLOGY CO., LTD., Tianjin (CN); GUANGDONG AIKO SOLAR ENERGY TECHNOLOGY CO., LTD., Foshan (CN); SHENZHEN AIKO DIGITAL ENERGY TECHNOLOGY CO., LTD., Shenzhen (CN)

(72) Inventors: Ruimin Liu, Zhuhai (CN); Yongqian Wang, Zhuhai (CN); Gang Chen, Zhuhai (CN)

(73) Assignees: ZHUHAI FUSHAN AIKO SOLAR TECHNOLOGY CO., LTD., Zhuhai (CN); ZHEJIANG AIKO SOLAR ENERGY TECHNOLOGY CO., LTD., Yiwu City (CN); TIANJIN AIKO SOLAR ENERGY TECHNOLOGY CO. LTD., Tianjin (CN); GUANGDONG AIKO SOLAR ENERGY TECHNOLOGY CO., LTD., Foshan (CN); SHENZHEN AIKO DIGITAL ENERGY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 19/261,925

(22) Filed: Jul. 7, 2025

(65) Prior Publication Data

US 2025/0338667 A1 Oct. 30, 2025

Related U.S. Application Data

(63) Continuation of application No. PCT/CN2024/106870, filed on Jul. 23, 2024.

(30) Foreign Application Priority Data

Sep. 22, 2023 (CN) .......................... 202311238215.2
Sep. 22, 2023 (CN) .......................... 202322596534.2

(51) Int. Cl.
H10F 77/14 (2025.01)
H10F 10/14 (2025.01)
H10F 77/30 (2025.01)

(52) U.S. Cl.
CPC ......... H10F 77/147 (2025.01); H10F 10/146 (2025.01); H10F 77/311 (2025.01)

(58) Field of Classification Search
None
See application file for complete search history.

(56) References Cited

U.S. PATENT DOCUMENTS

2005/0016585 A1 1/2005 Munzer
2010/0055822 A1* 3/2010 Weidman .............. H10F 19/908
438/57
2016/0284917 A1 9/2016 Rim

FOREIGN PATENT DOCUMENTS

CN 113394304 A 9/2021
CN 116314400 A 6/2023
(Continued)

OTHER PUBLICATIONS

Guo, Jiun-Hua et al., "Laser-Grooved Backside Contact Solar Cells with 680-mV Open-Circuit Voltage" IEEE Transactions on Electron Devices, vol. 51, No. 12, 2186-2192. (Year: 2004).*
(Continued)

*Primary Examiner* — Tamir Ayad
(74) *Attorney, Agent, or Firm* — Scully, Scott, Murphy &
Presser, P.C.

(57)                    ABSTRACT

A back-contact solar cell, a battery assembly and a photo-voltaic system. In the back-contact solar cell, several grooves arranged at intervals are formed in a back surface of a silicon wafer, so as to divide the back surface of the silicon wafer into several first regions and second regions that are alternately arranged in sequence, in an arrangement direction of the first regions and the second regions, the silicon wafer is provided on the first regions and the edges of the grooves with extension portions that extrude to the upper side of the grooves, and second polarity doping layers are disposed on second tunneling layers in a stacked manner and have a preset distance with the edges of the grooves.

16 Claims, 4 Drawing Sheets

(56)                    References Cited

FOREIGN PATENT DOCUMENTS

| | | |
|---|---|---|
| CN | 221239624 U | 6/2024 |
| WO | 2023123814 A1 | 7/2023 |

OTHER PUBLICATIONS

The search report of PCT application No. PCT/CN2024/106870 issue on Oct. 17, 2024.

* cited by examiner

200

100          100

BACK-CONTACT SOLAR CELL, BATTERY ASSEMBLY AND PHOTOVOLTAIC SYSTEM

CROSS-REFERENCE TO RELATED APPLICATIONS

The present application is a continuation of PCT International Application No. PCT/CN2024/106870 filed on 2024 Jul. 23, which claims priority to and benefits of Chinese Application No. 202311238215.2 and Chinese Application No. 202322596534.2 filed with the State Intellectual Property Office of China on Sep. 22, 2023, and the entire contents of each of which are herein incorporated by reference.

TECHNICAL FIELD

The present application relates to the technical field of solar cells, and particularly relates to a back-contact solar cell, a battery assembly and a photovoltaic system.

BACKGROUND

A back-contact solar cell is a battery in which both an emitter and a base contact electrode are placed on a back surface (a non-light-receiving surface) of the battery, and a light-receiving surface of the battery is not shielded by any metal electrode, thereby effectively increasing the short-circuit current of the battery.

In the related art, in order to solve the surface passivation problem of a groove region on the back surface of a back-contact battery and to reduce hydrogen-related defects in a body region, a passivation contact region requires a defect state of a hydrogen passivation tunneling layer, which requires the usage of a high-refractive-index passivation film (e.g., SiNx having a high refractive index) to achieve a better movable hydrogen content, and if excessive hydrogen enters a substrate region, the battery may attenuate. At the same time, a passivation layer (e.g., AlOx) in the groove region is prone to field passivation of negative charges, which induces a $p^+$layer on the surface, a space charge region is generated at the contact of the $p^+$layer and an n++layer, and if the region is recombined, composite current in a junction region of the battery is increased, such that the performance of the battery is significantly reduced.

SUMMARY

The present application provides a back-contact solar cell, a battery assembly and a photovoltaic system.

In an embodiment of the present application includes:

a silicon wafer, wherein the silicon wafer has a front surface and a back surface that are opposite to each other, several grooves arranged at intervals are formed in the back surface, so that the back surface includes several first regions and second regions that are alternately arranged in sequence, and the first regions and the second regions adjacent to each other are spaced apart by the grooves; in an arrangement direction of the first regions and the second regions, the silicon wafer is provided on the first regions and the edges of the grooves with extension portions that extrude and protrude to the upper side of the grooves;

first tunneling layers, wherein the first tunneling layers are overlaid on the first regions in a stacked manner;

first polarity doping layers, wherein the first polarity doping layers are disposed on the first tunneling layers and the extension portions in the stacked manner;

second tunneling layers, wherein the second tunneling layers are disposed on the second regions in the stacked manner;

second polarity doping layers, wherein the second polarity doping layers are disposed on the second tunneling layers in the stacked manner and have a preset distance with the edges of the grooves; and a passivation film layer, wherein the passivation film layer covers the first polarity doping layers, the second polarity doping layers and the grooves.

In some embodiments, in the arrangement direction of the first regions and the second regions, the length of the extension portion ranges from 0.2 μm to 50 μm.

In some embodiments, in the arrangement direction of the first regions and the second regions, the length of the extension portion ranges from 1 μm to 15 μm.

In some embodiments, the size of the preset distance ranges from 0.1 μm to 50 μm.

In some embodiments, the size of the preset distance ranges from 1 μm to 20 μm.

In some embodiments, the surface of the second region is flush with the surface of the first region.

In some embodiments, the distance between the surface of the second region and the bottom of the groove is less than the distance between the surface of the first region and the bottom of the groove.

In some embodiments, a side surface of the groove is an inclined surface.

In some embodiments, in the arrangement direction of the first regions and the second regions, the first polarity doping layer is provided with a protruding portion that protrudes from the extension portion and is located above the groove.

In some embodiments, in the arrangement direction of the first regions and the second regions, the length of the protruding portion ranges from 0.1 μm to 50 μm.

In some embodiments, the bottom surface and the side surface of the groove and the surface of the extension portion that faces the groove each has a concave-convex texture structure.

In some embodiments, the roughness of the bottom surface of the groove is greater than the roughness of the side surface of the groove, and the roughness of the side surface of the groove is greater than the roughness of the surface of the extension portion that faces the groove.

In some embodiments, the surface of the silicon wafer between the second polarity doping layer and the edge of the groove is a polished surface, and the roughness of the surface of the extension portion that faces the groove is greater than the roughness of the surface of the silicon wafer between the second polarity doping layer and the edge of the groove.

In some embodiments, the width of the groove ranges from 2 μm to 200 μm.

In some embodiments, a recess depth of the groove ranges from 0.2 μm to 10 μm.

The present application further provides a battery assembly, including the back-contact solar cell according to any of the foregoing.

The present application further provides a photovoltaic system, including the above battery assembly.

Figure 1:
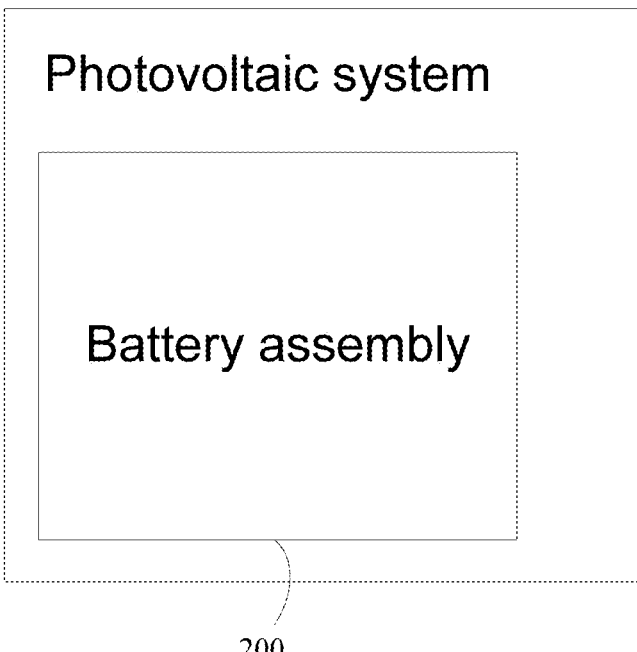
FIG. 1 is a schematic diagram of modules of a photovoltaic system provided in an embodiment of the present application.

DESCRIPTION OF MAIN ELEMENT SYMBOLS photovoltaic system 1000, battery assembly 200, back-contact solar cell 100, silicon wafer 10, front surface 11, back surface 12, groove 121, side surface 122, first region 122, second region 123, extension portion 13, first tunneling layer 20, first polarity doping layer 30, protruding portion 131, second tunneling layer 40, second polarity doping layer 50, passivation film layer 60, first electrode 70, and second electrode 80.

DETAILED DESCRIPTION OF THE EMBODIMENTS

To make the objectives, technical solutions and advantages of the present application clearer, the present application will be further described below in detail with in combination with the drawings and embodiments. Examples of the embodiments are shown in the drawings, in which the same or similar reference signs represent the same or similar elements or elements with the same or similar functions throughout. The embodiments described below with reference to the drawings are exemplary and are merely intended to explain the present application, and cannot be construed as limiting the present application. In addition, it should be understood that the specific embodiments described herein are only used to explain the present application and are not intended to limit the present application.

In the description of the present application, it should be understood that orientation or position relationships indicated by terms "thickness", "width", "upper", "lower", "lateral", "longitudinal" and the like are orientation or position relationships shown on the basis of the drawings, and are merely for the convenience of describing the present application and simplifying the description, but do not indicate or imply that the referred apparatuses or elements must have specific orientations or must be constructed and operated in specific orientations, and thus cannot be construed as limitations to the present application.

In addition, the terms "first" and "second" are used for descriptive purposes only and cannot be understood as indicating or implying relative importance or implicitly indicating the number of indicated technical features. Thus, features defined with "first" and "second" may explicitly or implicitly include one or more of the features. In the description of the present application, "a plurality of" means two or more, unless otherwise specifically defined.

In the description of the present application, it should be noted that unless otherwise expressly specified and limited, the terms "installed", "connected" and "connection" should be understood in a broad sense, for example, the connection may be a fixed connection, and may also be a detachable connection, or an integral connection; may be a mechanical connection, and may also be an electrical connection or mutual communication; and may be a direct connection, may be an indirect connection through an intermediate medium, and may also be internal communication between two elements or an interaction relationship between the two elements. For those ordinary skilled in the art, the specific meanings of the above terms in the present application may be understood according to specific situations.

In the present application, unless otherwise specified and limited, a first feature being "on" or "under" a second feature may include a direct contact between the first feature and the second feature, and may also include that the first feature and the second feature are not in direct contact, but are in contact through another feature therebetween. Moreover, the first feature being "on the top of", "above" and "over" of the second feature includes that the first feature is directly above and obliquely above the second feature, or merely indicates that a horizontal height of the first feature is higher than that of the second feature. The first feature being "under", "below" and "beneath" the second feature includes that the first feature is directly below and obliquely below the second feature, or merely indicates that the horizontal height of the first feature is less than that of the second feature.

The following disclosure provides many different embodiments or examples for implementing different structures of the present application. In order to simplify the disclosure of the present application, components and settings of specific examples are described below. Of course, they are merely examples, and are not intended to limit the present application. In addition, the present application may repeat reference numerals and/or reference letters in different examples, and this repetition is for the purpose of simplicity and clarity, and does not indicate the relationship between various embodiments and/or settings discussed. In addition, the present application provides examples of various specific processes and materials, but those ordinary skilled in the art may be aware of applications of other processes and/or usage scenarios of other materials.

In the present application, since a silicon wafer is provided with extension portions that extrude to the upper side of grooves, the silicon wafer can form recessed regions with small openings and large exteriors, so that the exchange between plasma and the outside during a deposition process of passivation film layer can be reduced, and localized distribution of movable hydrogen content of the passivation film layer can be realized, accordingly the movable hydrogen content of the passivation film layer in the grooves is lower, and the movable hydrogen content of the passivation film layer in the remaining regions is higher, thereby achieving optimal passivation and anti-attenuation effects. On the other hand, since second polarity doping layers have a preset distance with the edges of the grooves, formed platform regions can increase the movable hydrogen content of the passivation film layer in an upper local region of a space charge region, thereby enhancing the hydrogen passivation in this region, reducing the recombination of the space charge region, and improving the performance of a battery.

Embodiment 1

Figure 2:
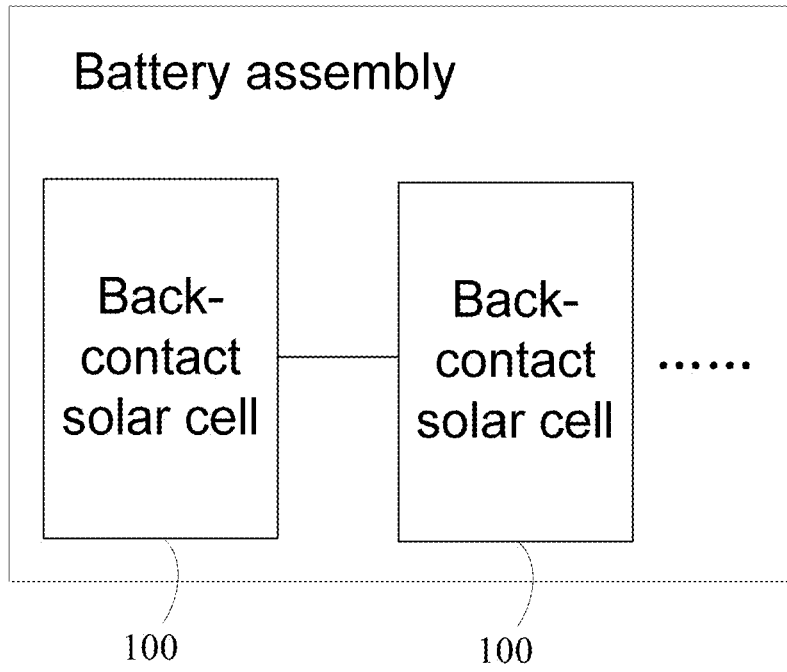
FIG. 2 is a schematic diagram of modules of a battery assembly provided in an embodiment of the present application.

Referring to FIG. 1 and FIG. 2, a photovoltaic system 1000 in the embodiment of the present application may include a battery assembly 200 in the embodiment of the present application, and the battery assembly 200 in the embodiment of the present application may include a plurality of back-contact solar cells 100 in the embodiment of the present application.

In some embodiments, the plurality of back-contact solar cells 100 in the battery assembly 200 may be sequentially connected in series to form a battery string, and the battery strings may be connected in series, in parallel, or in a series-parallel combination manner to realize confluence output of current, for example, the connection between the battery cells may be realized by welding a welding strip, and the connection between the battery strings may be realized by a bus bar.

Figure 3:
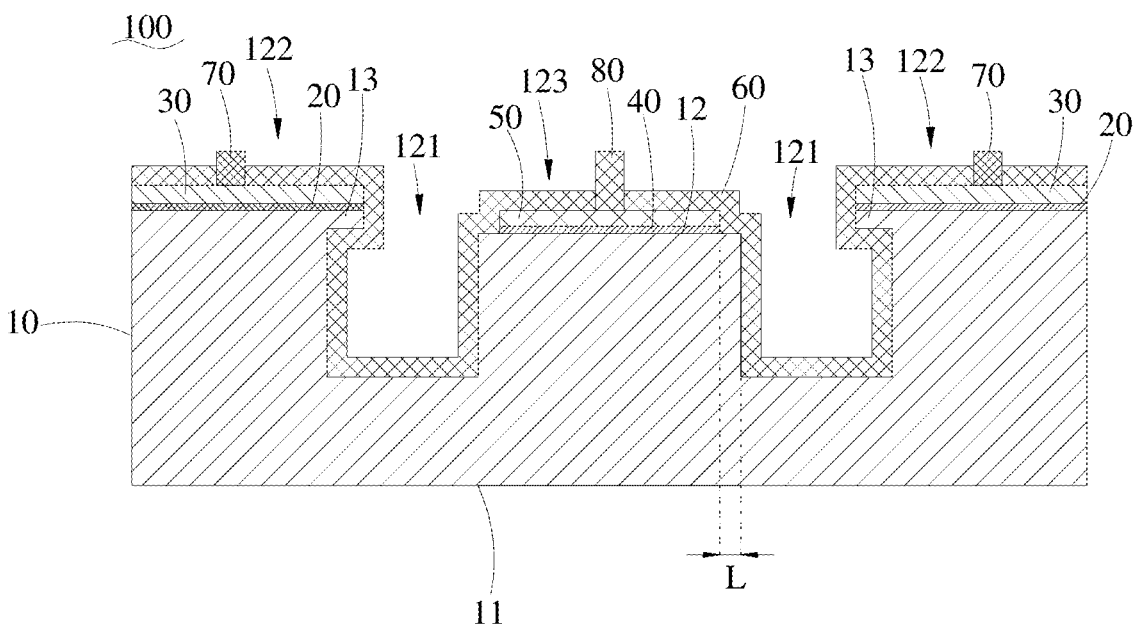
FIG. 3 is a schematic diagram of a sectional structure of a back-contact solar cell provided in an embodiment of the present application.

Referring to FIG. 3, the back-contact solar cell 100 in the embodiment of the present application may include a silicon wafer 10, first tunneling layers 20, first polarity doping layers 30, second tunneling layers 40, second polarity doping layers 50, and passivation film layer 60.

The silicon wafer 10 has a front surface 11 and a back surface 12 that are opposite to each other, several grooves 121 arranged at intervals are formed in the back surface 12, so that the back surface 12 includes several first regions 122 and second regions 123 that are alternately arranged in sequence, and the first regions 122 and the second regions 123 adjacent to each other are spaced apart by the grooves 121. For example, the first regions 122 and the second regions 123 may be alternately arranged in a lateral direction of the back-contact solar cell 100, and the grooves 121 extend in a longitudinal direction to space apart the first regions 122 and the second regions 123 adjacent to each other.

As shown in FIG. 3, in an arrangement direction of the first regions 122 and the second regions 123, the silicon wafer 10 is provided on the first regions 122 and the edges of the grooves 121 with extension portions 13 that extrude and protrude to the upper side of the grooves 121.

The first tunneling layers 20 are overlaid on the first regions 122 in a stacked manner, and the first polarity doping layers 30 are disposed on the first tunneling layers 20 and the extension portions 13 in the stacked manner. The second tunneling layers 40 are disposed on the second regions 123 in the stacked manner, and the second polarity doping layers 50 are disposed on the second tunneling layers 40 in the stacked manner and have a preset distance L with the edges of the grooves 121.

The passivation film layer 60 may cover the back surface 12 of the entire silicon wafer 10, that is, the passivation film layer 60 may cover the first polarity doping layers 30, the second polarity doping layers 50, and the grooves 121.

In the back-contact solar cell 100, the battery assembly 200 and the photovoltaic system 1000 in the embodiment of the present application, several grooves 121 arranged at intervals are formed in the back surface 12 of the silicon wafer 10, so as to divide the back surface 12 of the silicon wafer 10 into several first regions 122 and second regions 123 that are alternately arranged in sequence, in the arrangement direction of the first regions 122 and the second regions 123, the silicon wafer 10 is provided on the first regions 122 and the edges of the grooves 121 with the extension portions 13 that extrude and protrude to the upper side of the grooves 121, and the second polarity doping layers 50 are disposed on the second tunneling layers 40 in the stacked manner and have the preset distance L with the edges of the grooves 121. In this way, on one hand, since the silicon wafer 10 is provided with the extension portions 13 that extend and protrude to the upper side of the grooves 121, the silicon wafer 10 can form recessed regions with small openings and large exteriors, so that the exchange between plasma and the outside during a deposition process of the passivation film layer 60 (e.g., SiNx film layers) can be reduced, and localized distribution of movable hydrogen content of the passivation film layer can be realized, accordingly the movable hydrogen content of the passivation film layer 60 in the grooves 121 is lower, and the movable hydrogen content of the passivation film layer 60 in the remaining regions is higher, thereby achieving optimal passivation and anti-attenuation effects. On the other hand, since the second polarity doping layers 50 have the preset distance L with the edges of the grooves 121 (that is, there are platform regions between the second polarity doping layers 50 and the grooves 121), the formed platform regions can increase the movable hydrogen content of the passivation film layer 60 in an upper local region of a space charge region, thereby enhancing the hydrogen passivation in this region, reducing the recombination of the space charge region, and improving the performance of the battery.

Specifically, in the embodiment of the present application, the front surface 11 is a surface that receives light during the operation of the back-contact solar cell 100, and the back surface 12 is a backlight surface during the operation of the back-contact solar cell 100. The silicon wafer 10 may be a monocrystalline silicon wafer 10 or a polycrystalline silicon wafer 10, and may be a P-type silicon wafer 10 or an N-type silicon wafer 10, which is not specifically limited herein. The grooves 121 on the silicon wafer 10 and the extension portions 13 of the silicon wafer 10 may be formed in a combined manner of grooving and etching, for example, small openings may be formed on the silicon wafer 10 at first, and then the openings are etched by acid etching or alkali etching to form recessed regions (i.e., the grooves 121) with small openings and large interiors, and then the extension portions 13 protruding and extending to the upper side of the grooves 121 are formed, thereby reducing the exchange between the plasma and the outside during the deposition process of the passivation film layer 60.

It can be understood that "there being the preset distance L between the second polarity doping layer 50 and the groove 121" means that there is the preset distance L between the edge of the second polarity doping layer 50 that is close to the groove 121 and the edge of the groove 121 in the arrangement direction of the first regions 122 and the second regions 123.

In the embodiment of the present application, the first polarity doping layer 30 may be one of a P-type doping layer and an N-type doping layer, and the second polarity doping layer 50 may be the other of the P-type doping layer and the N-type doping layer. For example, in some embodiments, the first polarity doping layer 30 may be a P-type doping layer, the second polarity doping layer 50 may be an N-type doping layer, and both the first tunneling layer 20 and the second tunneling layer 40 may be one or a combination of more of a tunneling oxide layer (e.g., a tunneling silicon oxide layer), an intrinsic silicon carbide layer and an intrinsic amorphous silicon layer, which is not specifically limited herein.

Specifically, the passivation film layer 60 may preferably include an aluminum oxide layer and a silicon nitride layer, which are disposed in the stacked manner, and of course, may also include one or a combination of more of a silicon oxynitride layer, an intrinsic silicon carbide layer, an intrinsic amorphous silicon layer and a silicon oxide layer, which is not specifically limited herein.

In addition, the back-contact solar cell 100 is further provided with first electrodes 70 and second electrodes 80, the first electrodes 70 may be disposed in the first regions 122 and penetrate through the passivation film layer 60 to be in ohmic contact with the first polarity doping layers 30, the second electrodes 80 may be disposed in the second regions 123 and penetrate through the passivation film layer 60 to be in ohmic contact with the second polarity doping layers 50, and both the first electrodes 70 and the second electrodes 80 may be metal electrodes.

In the embodiment of the present application, the back surface 12 of the silicon wafer 10 may be a polished surface or a textured surface, and the textured surface may be, for example, a surface having relatively high roughness, such as a suede. In some embodiments, in some embodiments, the region in the second region 123 that is covered by the second polarity doping layer 50 may be a polished surface, and the region in the second region 123 that is not covered by the second polarity doping layer 50 may be a textured surface, of course, the region in the second region 123 that is not covered by the second polarity doping layer 50 may also be a polished surface, that is, the surface of the silicon wafer between the second polarity doping layer 50 and the edge of the groove 121 is a polished surface.

It can be understood that in the embodiment of the present application, the battery assembly 200 may further include a metal frame, a back plate, photovoltaic glass and an adhesive film (not shown in the figures). The adhesive film may be filled between the front surface 11 of the back-contact solar cell 100 and the photovoltaic glass, the back surface 12, the back plate, adjacent battery cells and the like to serve as a filler, the adhesive film may be transparent colloid having good light transmittance and aging resistance, for example, the adhesive film may be an EVA adhesive film or a POE adhesive film, which may be specifically selected according to actual situations and is not limited herein.

The photovoltaic glass may be overlaid on the adhesive film on the front surface 11 of the back-contact solar cell 100, the photovoltaic glass may be ultra-white glass, which has high light transmittance and high transparency, and has excellent physical, mechanical and optical properties, for example, the ultra-white glass has light transmittance higher than 92%, and thus can protect the back-contact solar cell 100 as much as possible without affecting the efficiency of the back-contact solar cell 100. Meanwhile, the adhesive film may bond the photovoltaic glass and the back-contact solar cell 100 together, therefore the back-contact solar cell 100 can be subjected to sealing and insulation, as well as water protection and moisture protection due to the presence of the adhesive film.

The back plate may be attached to the adhesive film on the back surface 12 of the back-contact solar cell 100, the back plate may protect and support the back-contact solar cell 100, and has reliable insulativity, water resistance and aging resistance, the back plate may be made of a plurality of materials, which may be generally tempered glass, organic glass, an aluminum alloy TPT composite adhesive film and the like, and the back plate may be specifically set according to specific conditions, which is not limited herein. An entirety formed by the back plate, the back-contact solar cell 100, the adhesive film and the photovoltaic glass may be disposed on the metal frame, the metal frame serves as a main external supporting structure of the entire battery assembly 200, and may stably support and install the battery assembly 200, for example, the battery assembly 200 may be installed by the metal frame at a position where the battery assembly 200 needs to be installed.

In some embodiments, in the present embodiment, the photovoltaic system 1000 may be applied to a photovoltaic power station, such as a ground power station, a roof power station, a water surface power station or the like, and may also be applied to a device or an apparatus for generating power by using solar energy, for example, a user solar power supply, a solar street lamp, a solar vehicle, a solar building or the like. Certainly, it can be understood that the application scenario of the photovoltaic system 1000 is not limited thereto, that is, the photovoltaic system 1000 may be applied to all fields in which solar energy needs to be used for power generation. Taking a photovoltaic power generation system network as an example, the photovoltaic system 1000 may include a photovoltaic array, a combiner box and an inverter, the photovoltaic array may be an array combination of a plurality of battery assemblies 200, for example, the plurality of battery assemblies 200 may form a plurality of photovoltaic arrays, the photovoltaic array is connected with the combiner box, the combiner box may converge current generated by the photovoltaic array, and the converged current flows through the inverter to be converted into alternating current required by a mains power grid and then is connected to a mains supply network to implement solar power supply.

Embodiment 2

In some embodiments, in the arrangement direction of the first regions 122 and the second regions 123, the length of the extension portion 13 may range from 0.2 μm to 50 μm.

In this way, by defining the length of the extension portion 13 within this reasonable range, the length of the extension portion 13 can be prevented from being too small to effectively achieve the function of reducing the exchange between plasma and the outside during the deposition process of the passivation film layer, and the length of the extension portion 13 can also be prevented from being too large to result in an excessively small opening of the groove 121 and excessively large etching process difficulty, and meanwhile, the length of the extension portion 13 can also be prevented from being too large to result in breakage.

Specifically, in such an embodiment, the length of the extension portion 13 may be, for example, 0.2 μm, 0.4 μm, 0.6 μm, 0.8 μm, 1 μm, 2 μm, 3 μm, 4 μm, 5 μm, 6 μm, 7 μm, 8 μm, 9 μm, 10 μm, 20 μm, 30 μm, 40 μm, 50 μm, or any value between 0.2 μm to 50 μm.

In some embodiments, according to researches and verification of inventors of the present application, it is discovered that to better prevent the breakage of the extension portion 13 and to ensure the function of reducing the exchange between the plasma and the outside during the deposition process of the passivation film layer, the length of the extension portion 13 in the present application most preferably ranges from 1 μm to 15 μm.

Embodiment 3

Referring to FIG. 3, in some embodiments, the size of the preset distance L may range from 0.1 μm to 50 μm.

In this way, by defining the distance between the second polarity doping layer 50 and the groove 121 within the above reasonable range, it can be ensured that the platform region between the second polarity doping layer 50 and the edge of the groove 121 has a reasonable size, so that the movable hydrogen content of a local passivation film layer on the platform region can be effectively increased, thereby realizing hydrogen passivation enhancement of the local region, reducing the recombination of the space charge region, and avoiding the overall efficiency of the battery being affected by excessively low collection efficiency of carriers due to the fact that the area of the second region 123 without the second polarity doping layer 50 is too large due to the excessively large preset distance L.

Specifically, in the present application, the size of the preset distance L may be, for example, 0.1 μm, 0.2 μm, 0.3 μm, 0.4 μm, 0.5 μm, 1 μm, 2 μm, 3 μm, 4 μm, 5 μm, 6 μm, 7 μm, 8 μm, 9 μm, 10 μm, 20 μm, 30 μm, 40 μm, 50 μm, or any value between 0.1 μm-50 μm.

In some embodiments, according to the researches and verification of the inventors of the present application, it is discovered that in the embodiment of the present application, the size of the preset distance L may preferably range from 1 μm to 20 μm. In this way, the overall efficiency of the battery can be ensured while the recombination of the space charge region can be reduced.

Embodiment 4

Referring to FIG. 3, in some embodiments, the surface of the second region 123 is flush with the surface of the first region 122.

In this way, the first region 122 and the second region 123 can be directly formed by using the silicon wafer 10 without performing other processes such as etching.

Embodiment 5

Figure 4:
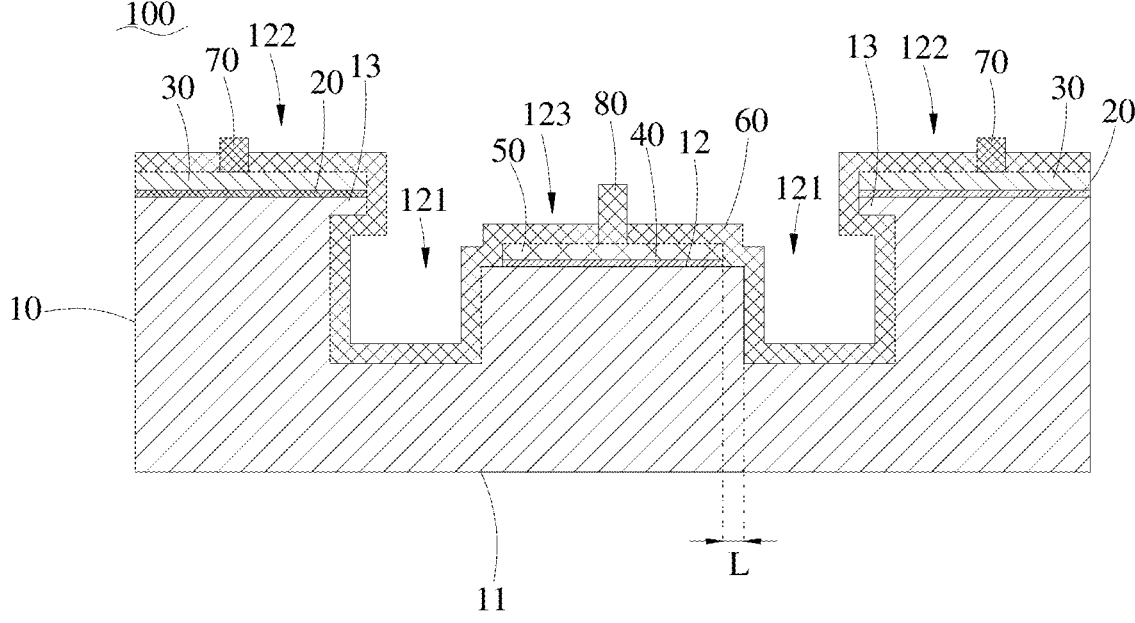
FIG. 4 is a schematic diagram of another sectional structure of a back-contact solar cell provided in an embodiment of the present application.

Referring to FIG. 4, in some embodiments, the distance between the surface of the second region 123 and the bottom of the groove 121 is less than the distance between the surface of the first region 122 and the bottom of the groove 121, that is, the surface of the second region 123 sinks into the silicon wafer 10.

In this way, when the second polarity doping layer 50 is an N-type doping layer, when the battery is transported during a production process, the surface may contact components such as a belt and a roller, which may cause scratches to the surface, wherein the etching rate of an alkali solution to an N-type surface is higher than that of a P-type surface, so that the N-type surface will be more likely to be etched away in the alkali solution due to the scratches to cause a failure, therefore, by sinking the N-type surface, the scratches of the N-type surface during the transportation process can be avoided, thus reducing the failure risk.

Embodiment 6

Figure 5:
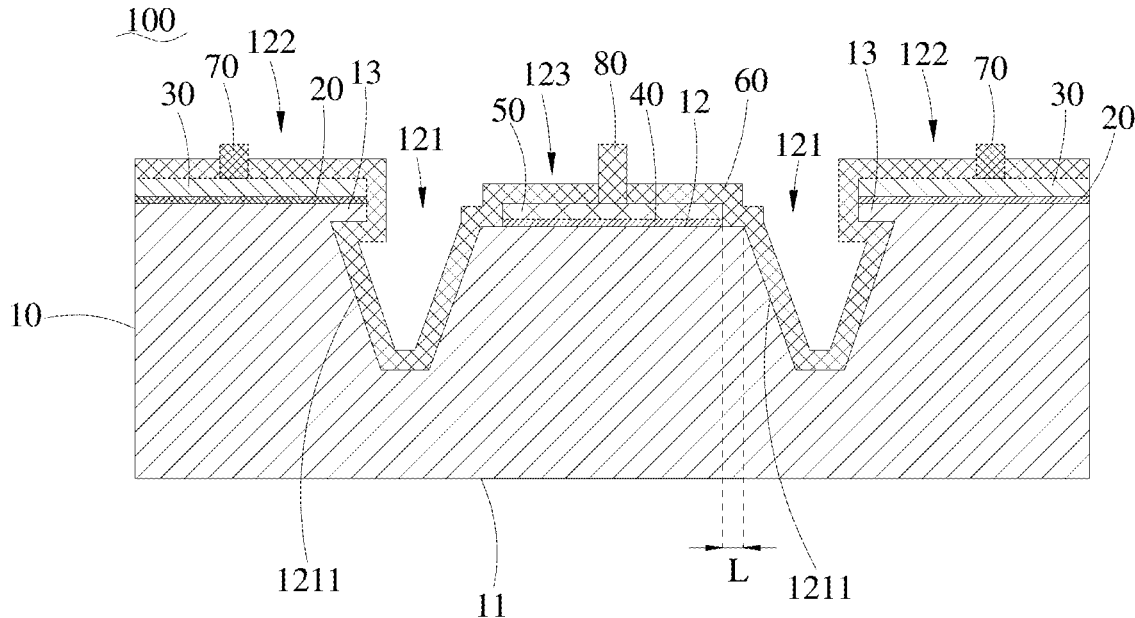
FIG. 5 is a schematic diagram of yet another cross-sectional structure of a back-contact solar cell provided in an embodiment of the present application.

Referring to FIG. 5, in some embodiments, a side surface 122 of the groove 121 (i.e., the bottom surface of the groove 121 is connected to the surface of the first region 122 and the surface of the surface of the second region 123) is an inclined surface.

In this way, since a vertical crystal plane has more defects, by forming the inclined side surface 122, surface defect states of the groove 121 can be less, and by forming the inclined surface, surface recombination can be reduced, and the performance of the battery can be improved.

Embodiment 7

Figure 6:
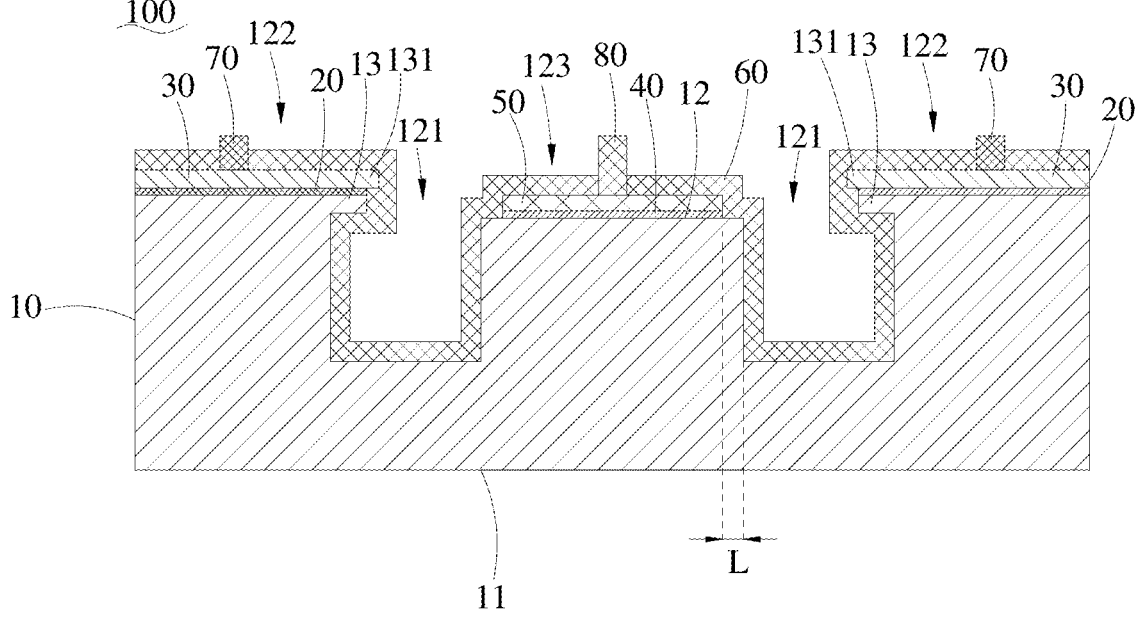
FIG. 6 is a schematic diagram of still another cross-sectional structure of a back-contact solar cell provided in an embodiment of the present application.

Referring to FIG. 6, in some embodiments, in the arrangement direction of the first regions 122 and the second regions 123, the first polarity doping layer 30 is provided with a that protrudes from the extension portion 13 and is located above the groove 121.

In this way, since the first polarity doping layer 30 is provided with the protruding portion 131 that protrudes to the upper side of the groove 121, when the second polarity doping layer 50 is deposited, a local second doping layer can be selectively in contact with the protruding portion 131, thereby improving a subsequent electric injection effect, and thus improving the subsequent repair efficiency and repair effect of the back-contact solar cell 100.

In some embodiments, in the arrangement direction of the first regions 122 and the second regions 123, the length of the protruding portion 131 may range from 0.1 μm to 50 μm. In this way, the phenomenon of breakage caused by an excessively large length of the protruding portion 131 can be avoided.

Specifically, in the present application, the length of the protruding portion 131 may be, for example, 0.1 μm. 0.2 μm, 0.3 μm, 0.4 μm, 0.5 μm, 1 μm, 2 μm, 3 μm, 4 μm, 5 μm, 6 μm, 7 μm, 8 μm, 9 μm, 10 μm, 20 μm, 30 μm, 40 μm, 50 μm, or any value between 0.1 μm and 50 μm, which is not specifically limited herein. Preferably, the length of the protruding portion 131 may range from 1 μm to 20 μm.

Embodiment 8

In some embodiments, the bottom surface and the side surface 1211 of the groove 121 and the surface of the extension portion 13 that faces the groove each has a concave-convex texture structure.

In this way, by forming the concave-convex texture structures on the three surfaces, the reflection of incident light entering the silicon wafer 10 can be increased, thereby increasing the number of rays absorbed by the battery and improving the conversion efficiency of the battery.

In some embodiments, in such an embodiment, the roughness of the bottom surface of the groove 121 is greater than the roughness of the side surface 1211 of the groove 121, and the roughness of the side surface 1211 of the groove 121 is greater than the roughness of the surface of the extension portion 13 that faces the groove. In this way, by setting different texture structures with different roughness sizes, the wettability of local regions can be improved, and the cleaning effect can be improved when the battery cells are cleaned.

In addition, in some embodiments, the surface of the silicon wafer (i.e., the surface of the platform region) between the second polarity doping layer 50 and the edge of the groove 121 is a polished surface, and the roughness of the surface of the extension portion 13 that faces the groove 121 is greater than the roughness of the surface of the silicon wafer between the second polarity doping layer 50 and the edge of the groove 121.

Embodiment 9

In some embodiments, in some embodiments, the width of the groove 121 ranges from 2 μm to 200 μm.

In this way, by defining the width of the groove 121 within this reasonable range, on one hand, it can be avoided that the width of the groove 121 is too small to achieve the function of isolating the first polarity doping layer 30 from the second polarity doping layer 50, and on the other hand, it can be avoided that the area of an invalid region of the back-contact solar cell 100 is too large due to the fact that the width of the groove 121 is too large.

Specifically, in such an embodiment, the width of the groove 121 may be 2 μm, 4 μm, 6 μm, 8 μm, 10 μm, 20 μm, 40 μm, 60 μm, 80 μm, 100 μm, 120 μm, 140 μm, 160 μm, 180 µm, 200 µm or any value between 2 µm and 200 µm, which is not specifically limited herein.

Embodiment 10

In some embodiments, a recess depth of the groove 121 may range from 0.2 µm to 10 µm.

In this way, by defining the recess depth of the groove 121 within this reasonable range, it can be avoided that the groove 121 cannot achieve an effective isolation effect due to the fact that the depth of the groove 121 is too small, and it can also be avoided that the strength of the silicon wafer 10 at the groove 121 is greatly reduced due to the fact that the depth of the groove 121 is too large, and the breakage risk during the process of manufacturing the back-contact solar cell 100 is reduced, that is, if the depth of the groove 121 is too large, the position where the groove 121 is located is thinner, such that the strength of the back-contact solar cell 100 at the groove 121 is too small to be prone to breakage.

Specifically, in such an embodiment, the recess depth of the groove 121 may be 0.2 µm, 0.4 µm, 0.6 µm, 0.8 µm, 1 µm, 2 µm, 3 µm, 4 µm, 5 µm, 6 µm, 7 µm, 8 µm, 9 µm, 10 µm, or any value between 0.2 µm and 10 µm, which is not specifically limited herein.

In the description of the present specification, the description with reference to terms "some embodiments", "an exemplary embodiment", "an example", "a specific example", or "some examples" and the like means that specific features, structures, materials or characteristics described in combination with the embodiment or example is included in at least one embodiment or example of the present application. In the present specification, schematic representation of the above terms does not necessarily refer to the same embodiment or example. Furthermore, the described specific features, structures, materials or characteristics may be combined in a suitable manner in any one or more embodiments or examples.

In addition, the foregoing descriptions are merely preferred embodiments of the present application and are not intended to limit the present application, and any modifications, equivalent replacements, improvements and the like, made within the spirit and principles of the present application, shall fall within the protection scope of the present application.

What is claimed is:

1. A back-contact solar cell, comprising:
a silicon wafer, wherein the silicon wafer has a front surface and a back surface that are opposite to each other, grooves arranged at intervals are formed in the back surface, so that the back surface comprises first regions and second regions that are alternately arranged in sequence such that a respective first region of the first regions is adjacent to a respective second region of the second regions and the respective first and second regions are spaced apart by a respective groove of the grooves; in an arrangement direction of the first regions and the second regions, the silicon wafer is provided, in each first region and at an edge of the groove, with an extension portion that extrudes and protrudes to the upper side of the respective groove, and the extension portion and the respective grooves are disposed in a one-to-one manner;
first tunneling layers, wherein a respective first tunneling layer of the first tunneling layers is overlaid on each of the first regions in a stacked manner;

first polarity doping layers, wherein a respective first polarity doping layer of the first polarity doping layers is disposed on the respective first tunneling layers and the extension portion of each first region, in the arrangement direction of the first regions and the second regions, the first polarity doping layers are provided with protruding portions in a one-to-one manner, each of the protruding portions protrudes from the extension portion of each first region and is located above the respective groove;
second tunneling layers, wherein a respective second tunneling layer of the second tunneling layers is disposed on each of the second regions;
second polarity doping layers, wherein 3 respective second polarity doping layer of the second polarity doping layers is disposed on the respective second tunneling layer and is located at a preset distance from an opposing edge of the respective groove; and
a passivation film layer, wherein the passivation film layer covers the first polarity doping layers, the second polarity doping layers and the grooves.

2. The back-contact solar cell according to claim 1, wherein in the arrangement direction of the first regions and the second regions, a length of the extension portion in each first region ranges from 0.2 µm to 50 µm.

3. The back-contact solar cell according to claim 2, wherein in the arrangement direction of the first regions and the second regions, the length of the extension portion in each first region ranges from 1 µm to 15 µm.

4. The back-contact solar cell according to claim 1, wherein a size of the preset distance ranges from 0.1 µm to 50 µm.

5. The back-contact solar cell according to claim 4, wherein the size of the preset distance ranges from 1 µm to 20 µm.

6. The back-contact solar cell according to claim 1, wherein a surface of each of the second region is flush with a surface of each of the first regions.

7. The back-contact solar cell according to claim 1, wherein a distance between a surface of each of the second regions and a bottom of the respective groove is less than a distance between a surface of the each of the first regions and a bottom of the respective groove.

8. The back-contact solar cell according to claim 1, wherein a side surface of the each of the grooves is an inclined surface.

9. The back-contact solar cell according to claim 1, wherein in the arrangement direction of the first regions and the second regions, the length of each of the protruding portions ranges from 0.1 µm to 50 µm.

10. The back-contact solar cell according to claim 1, wherein each of a bottom surface and a side surface of the respective groove, and a surface of the extensions portion in each first region that faces the respective groove has a concave-convex texture structure.

11. The back-contact solar cell according to claim 10, wherein for each of the grooves, a roughness of a bottom surface of the groove is greater than a roughness of a side surface of the groove, and the roughness of the side surface of the groove is greater than a roughness of the surface of the extension portion in each first region that faces the respective groove.

12. The back-contact solar cell according to claim 1, wherein a surface of the silicon wafer between each of the second polarity doping layers and the opposing edge of the respective grooves is a polished surface, and a roughness of a surface of the extension portions in each first region that faces the respective groove is greater than a roughness of the surface of the silicon wafer between each of the second polarity doping layers and the opposing edge of the respective groove.

13. The back-contact solar cell according to claim 1, wherein a width of each of the grooves ranges from 2 μm to 200 μm.

14. The back-contact solar cell according to claim 1, wherein a recess depth of each of the grooves ranges from 0.2 μm to 10 μm.

15. A battery assembly, comprising several back-contact solar cells according to claim 1.

16. A photovoltaic system, comprising the battery assembly according to claim 15.

* * * * *